United States Patent
Wang et al.

(10) Patent No.: US 9,716,503 B2
(45) Date of Patent: Jul. 25, 2017

(54) FUNCTION PROGRAMMABLE CIRCUIT AND OPERATION METHOD THEREOF

(71) Applicant: Nuvoton Technology Corporation, Hsinchu (TW)

(72) Inventors: Cheng-Chih Wang, Hsinchu (TW); Hsi-Jung Tsai, Hsinchu (TW)

(73) Assignee: Nuvoton Technology Corporation, Hsinchu (TW)

(*) Notice: Subject to any disclaimer, the term of this patent is extended or adjusted under 35 U.S.C. 154(b) by 0 days.

(21) Appl. No.: 15/135,544

(22) Filed: Apr. 21, 2016

(65) Prior Publication Data
US 2017/0026045 A1    Jan. 26, 2017

(30) Foreign Application Priority Data

Jul. 22, 2015  (TW) .............................. 104123709 A

(51) Int. Cl.
*H03K 19/177*  (2006.01)
*H03K 19/00*  (2006.01)

(52) U.S. Cl.
CPC ... *H03K 19/17776* (2013.01); *H03K 19/0013* (2013.01); *H03K 19/1776* (2013.01)

(58) Field of Classification Search
CPC ......... H03K 19/17776; H03K 19/0013; H03K 19/1776
USPC .................................................... 326/38, 39
See application file for complete search history.

(56) References Cited

U.S. PATENT DOCUMENTS

| 6,317,367 | B1 | 11/2001 | Sample et al. |
| 6,631,520 | B1 | 10/2003 | Theron et al. |
| 7,068,069 | B2 | 6/2006 | Fujita |
| 7,193,436 | B2 | 3/2007 | Wang et al. |
| 7,516,303 | B2 | 4/2009 | Kundu et al. |
| 8,754,670 | B2* | 6/2014 | Kim ................ H03K 19/17704 326/38 |
| 2009/0237113 | A1* | 9/2009 | Marui ............. H03K 19/17796 326/39 |
| 2013/0027079 | A1 | 1/2013 | Nazarian et al. |

FOREIGN PATENT DOCUMENTS

| CN | 10354413 | 1/2014 |
| CN | 103530263 | 1/2014 |

OTHER PUBLICATIONS

"Office Action of Taiwan Counterpart Application", issued on Apr. 18, 2016, p. 1-p.4.

* cited by examiner

*Primary Examiner* — Daniel D Chang
(74) *Attorney, Agent, or Firm* — Jianq Chyun IP Office

(57) ABSTRACT

A function programmable circuit and an operation method thereof are provided. The function programmable circuit includes a micro-controller unit (MCU) and a field programmable gate array (FPGA). The FPGA is coupled to the MCU, and is capable of being configured to execute a first function and work with the MCU in a first period, while the FPGA is being programmed a second function by the MCU in the same first period. The FPGA is controlled by a function switch pulse output from the MCU to terminate the first period, and switched from the first function to the second function, and then executes the second function and works with the MCU in a second period.

8 Claims, 4 Drawing Sheets

FUNCTION PROGRAMMABLE CIRCUIT AND OPERATION METHOD THEREOF

CROSS-REFERENCE TO RELATED APPLICATION

This application claims the priority benefit of Taiwan application serial no. 104123709, filed on Jul. 22, 2015. The entirety of the above-mentioned patent application is hereby incorporated by reference herein and made a part of this specification.

BACKGROUND OF THE PRESENT DISCLOSURE

Field of the Present Disclosure

The present disclosure relates to a programmable circuit, and more particularly, to a function programmable circuit and an operating method of the function programmable circuit.

Description of Related Art

Because of the capabilities of micro-controller units (MCU) to highly integrate other elements and working with various peripheral elements (e.g. circuits with calculating functions, logic circuits, and/or memories), they are widely used in products e.g. automotive devices, hand held devices. Field programmable gate array (FPGA) is a configurable integrated circuit, with its internal configurable logic block (CLB) being programmable. In conventional technology, when the FPGA is programmed with a certain original function and configured to work with a MCU, a programming platform (or programming circuit) is not capable of programming a new function to the FPGA. During the process of the programming platform (or programming circuit) programming new function to the FPGA, the FPGA is unable to provide any function (including the certain original function and the new function) to the MCU. However, it often takes a long time to program a new function to the FPGA. The FPGA cannot use the new function to work with the MCU until the new function is completely programmed into the FPGA.

SUMMARY OF THE PRESENT DISCLOSURE

Accordingly, the present disclosure is directed to a programmable circuit and an operation method thereof in order to reduce the time wasted on switching between different functions.

The function programmable circuit of the present disclosure includes a micro-controller unit (MCU) and a field programmable gate array (FPGA). The FPGA is coupled to the MCU and configured to execute a first function and work with the MCU in a first period while the FPGA is being programmed a second function by the MCU in the same first period. The FPGA is controlled by a function switch pulse generated by the MCU to terminate the first period and switch from the first function to the second function, and then in a second period executes the second function and works with the MCU.

The operation method of the function programmable circuit includes following steps. In a first period, the first function is executed by a FPGA and the FPGA works with a MCU, while the FPGA is being programmed the second function by the MCU in the same first period. The MCU outputs a function switch pulse to terminate the first period and enable the FPGA to switch from the first function to the second function, and the FPGA executes the second function and works with the MCU in a second period.

Based on the above, the FPGA and the MCU described in the embodiments of the present disclosure work together. While the MCU programs the new function (the second function) to the FPGA, the FPGA is capable of executing the original function (the first function) and working with the MCU. Therefore, when the FPGA receives the function switch pulse from the MCU, the FPGA is capable of switching from the first function to the second function instantly, without wasting time for programming or converting.

To make the aforementioned and other features and advantages of the present disclosure more comprehensible, several embodiments accompanied with drawings are described in detail as follows.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

FIG. 1 is a block diagram of a function programmable circuit from an embodiment of the present disclosure.

FIG. 2 is a diagram of the operation sequence of the function programmable circuit of FIG. 1 according to an embodiment.

FIG. 3 is a diagram of the operation of the FPGA of FIG. 1, according to another embodiment.

FIG. 4 is a diagram of the operation sequence of the function programmable circuit of FIG. 3 according to another embodiment.

FIG. 5 is a diagram of the circuit structure of the FPGA of FIG. 1 according to an embodiment.

FIG. 6 is a diagram of an operation method for the function programmable circuit from an embodiment.

DESCRIPTION OF THE EMBODIMENTS

Reference will now be made in detail to the present preferred embodiments of the present disclosure, examples of which are illustrated in the accompanying drawings. Wherever possible, the same reference numbers are used in the drawings and the description to refer to the same or like parts.

Refer to FIG. 1. FIG. 1 is a block diagram of a function programmable circuit 100 from an embodiment of the present disclosure. The function programmable circuit 100 of the present embodiment includes a MCU 110 and a FPGA 120, and the MCU 110 is coupled to the FPGA 120. The MCU 110 can be a micro-processor capable of multifunction integration and having processing capabilities, a micro-controller, or a central processing unit (CPU), etc. The FPGA can be a programmable logic device, but no particular limitation is set in the present disclosure. In the present embodiment, the FPGA 120, after configuration/programming, is capable of a function (e.g. a first function, FUNC_1). The FPGA 120 is capable of executing the first function, FUNC_1 and working with MCU 110 in a first period.

Next refer to both FIG. 1 and FIG. 2. FIG. 2 is a diagram of the operation sequence of the programmable circuit 100 of FIG. 1 according to an embodiment. In FIG. 2, the horizontal axis represents time. In a first period T1, the FPGA 120 is capable of the first function FUNC_1 and the MCU 110 executes a task A so as to work with the FPGA 120. To give an example (but not limited to the following), the MCU 110 is capable of controlling the FPGA 120 via an interconnect bus Bus2, thereby causing the FPGA 120 to execute the first function FUNC_1. Note that at the time the MCU 110 executes the task A, it is also executing a task B, so as to program a new function (e.g. a second function FUNC_2) to the FPGA 120 via a programming bus Bus1. In other words, the FPGA 120, in the first period T1, in addition to executing the first function FUNC_1 and working with the MCU 110, is also being controlled by the MCU 110 to program the second function FUNC_2 to the FPGA 120. The programming of the second function FUNC_2 does not affect/interrupt the execution of the first function FUNC_1.

Next, after completely programming the second function FUNC_2 to the FPGA 120, the MCU 110 can output a function switch pulse Stri to the FPGA 120 via a control signal line SL. After receiving the function switch pulse Stri, the FPGA 120 is switched from the first function FUNC_1 to the second function FUNC_2, and the first period T1 is terminated. In the second time period T2 after the first period T1, the MCU 110 can execute a task C so as to work with the FPGA 120. As an example (but not limited to the following), the MCU 110 controls the FPGA 120 via the interconnect bus Bus2 while executing the task C, causing the FPGA 120 to execute the second function FUNC_2 in the second period T2.

In other words, the FPGA 120 is controlled by the function switch pulse Stri outputted by the MCU 110. The FPGA 120 receives the function switch pulse Stri and terminates the first period T1, and switches from the first function FUNC_1 to the second function FUNC_2, and in the second period T2 executes the second function FUNC_2 and works with the MCU 110. A user end can adjust the MCU 110 by software to generate the switching signal Stri, or the switching signal Stri can be generated by pre-setting the MCU 110, but the switching signal Stri of the present disclosure is not particularly limited.

Specifically, in the present embodiment, the MCU 110 is used to control the FPGA 120. In the first period T1, the MCU 110 is capable of programming the second function FUNC_2 to the FPGA 120 while controlling the FPGA 120 to execute the first function FUNC_1. Without stopping the first function FUNC_1 from being executed by the FPGA 120, the MCU 110 is capable of programming the second function FUNC_2 to the FPGA 120. Since the FPGA 120 has already programmed the second function FUNC_2 to the FPGA 120 while executing the first function FUNC_1, the FPGA 120 can instantly switch from the first function FUNC_1 to the second function FUNC_2 without wasting time to wait for the MCU to program.

Figure 1:
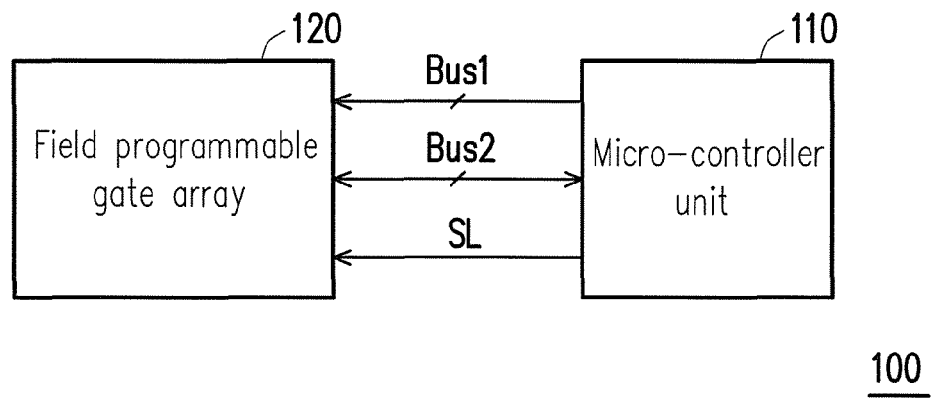
Figure 2:
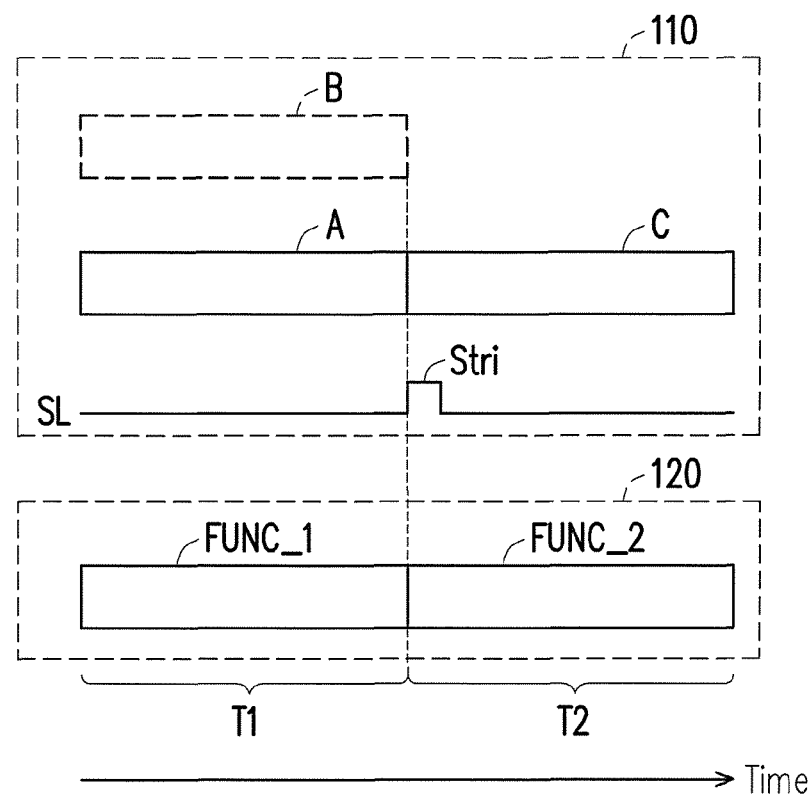
Figure 3:
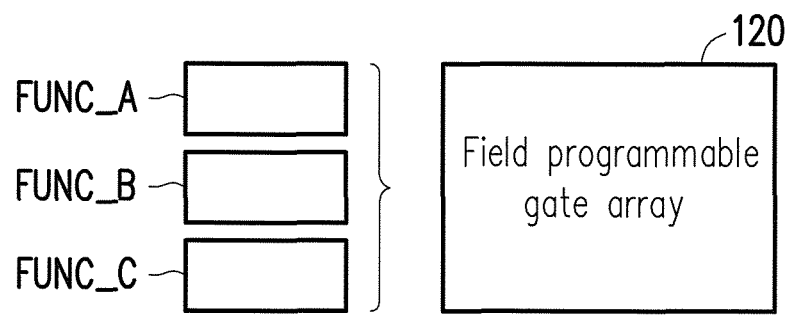
Figure 4:
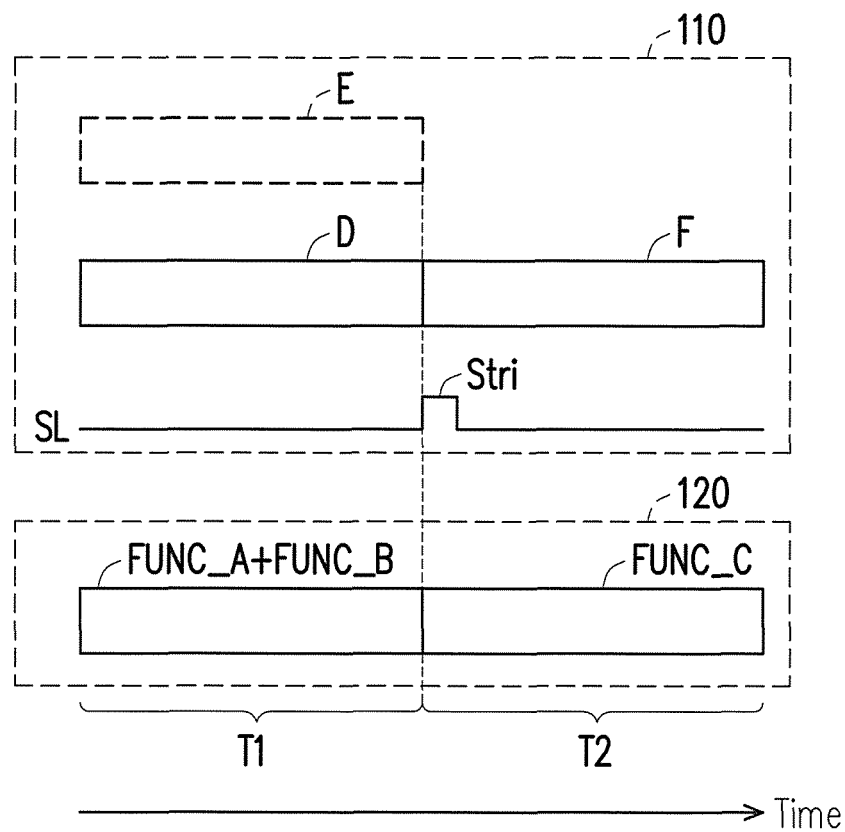

Next refer to both FIG. 3 and FIG. 4. FIG. 3 illustrates the operation of the FPGA 120 of FIG. 1 according to another embodiment. FIG. 4 illustrates the operation sequence of the FPGA 120 of FIG. 3 according to another embodiment. In the case that the FPGA 120 of the present embodiment has 10K transistors, execution of the FUNC_A, the FUNC_B, and the FUNC_C require 3K, 5K, and 10K transistors, respectively.

In the first period T1 of FIG. 4, the FPGA 120 is capable of the functions FUNC_A and the FUNC_B, and the MCU 110 is capable of executing a task D, so as to work with the FPGA 120. For instance, but not limited to the following, the MCU 110 is capable of controlling the FPGA 120 via the interconnect bus Bus2, to execute the function FUNC_A and the FUNC_B. Note that in the first period T1, the MCU 110 also executes a task E while executing the task D, so as to program a new function (e.g. the function FUNC_C) to the FPGA 120 via the programming bus Bus1. Programming of the function FUNC_C does not affect/interrupt the execution of the first functions FUNC_A and FUNC_B.

Next, the first period T1 is terminated and the FPGA 120 is switched from the FUNC_A and the FUNC_B to the FUNC_C when the FPGA 120 receives the function switch pulse Stri from the MCU 110 via the control signal line SL. In the second period T2, the MCU 110 is capable of executing a task F so as to work with the MCU 110. For instance, but not limited to the following, the MCU 110 controls the FPGA 120 via the interconnect bus Bus2 while executing the task F, and causes the FPGA 120 to execute the second function FUNC_C in the second period T2.

We can know from the above description that though the FUNC_A, the FUNC_B, and the FUNC_C cannot be burned to the FPGA 120 at the same time (because the total number of the transistors required by the three functions already exceeds the total number of transistors of the FPGA 120), however, by means of switching functions of the FPGA 120, the limited number of transistors of the FPGA 120 is capable of realizing more functions.

Figure 5:
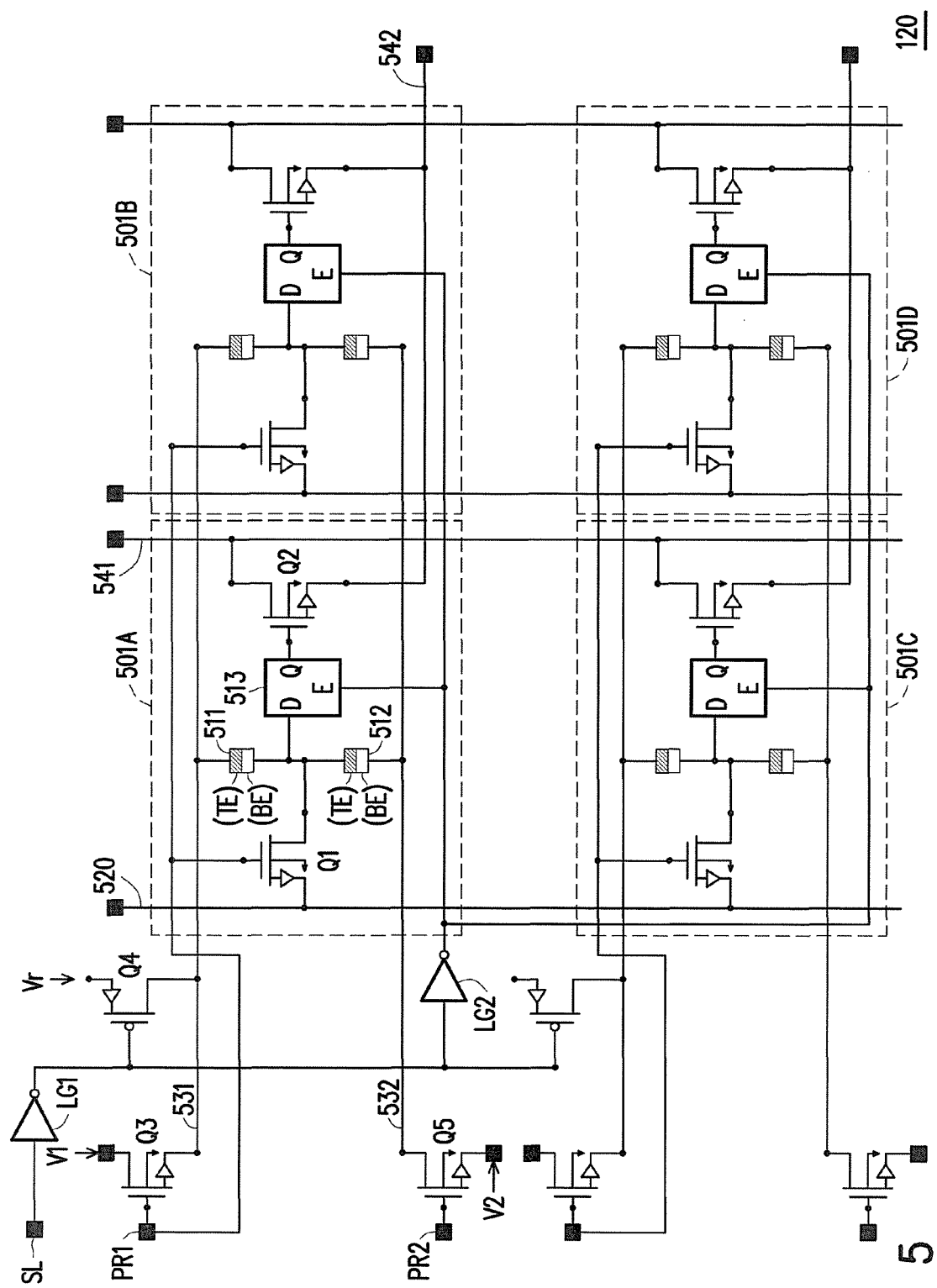

Next refer to FIG. 5. FIG. 5 is a diagram of the circuit structure of the FPGA 120 of FIG. 1 according to an embodiment. The FPGA 120 of the present embodiment includes a plurality of memory blocks, e.g. memory blocks 501A, 501B, 501C, and 501D of FIG. 5. In the following, the memory block 501A is used as an example. The other memory blocks are as described for the memory block 501A. The memory block 501A includes a first switch Q1, a first resistive nonvolatile memory element 511, a second resistive nonvolatile memory element 512, a latch unit 513, and a second switch Q2. The above described first switch Q1 and the second switch Q2 can be metal-oxide semi-conductor field-effect transistors, (MOSFET), bipolar junction transistor (BJT), or other switch circuits/elements. For instance, the first switch Q1 and the second switch Q2 of the present embodiment can be N-type metal-oxide-semiconductor (NMOS) field-effect transistors. The latch unit 513 can include a latch, a flip-flop, or another circuit/element that can be used to store data. The latch unit 513 of the present disclosure is not particularly limited.

The above described first resistive nonvolatile memory element 511 and the second resistive nonvolatile memory element 512 may adopt different implementation methods depending on different design demands. For instance, the first resistive nonvolatile memory element 511 can include a top electrode (TE), a variable resistor, and a bottom electrode (BE), wherein the variable resistor is disposed between the TE and the BE. The BE material can be $YBa_2Cu_3O_7$ (YBCO) or TiN, or oxides, nitrides, or oxygen nitride selected from manganese, iron, nickel, cobalt, titanium, copper, vanadium, silicon, or combination thereof (e.g. Ti, $SiO_2$, Si). The described variable transistor material can be Pr1–XCaXMnO$_3$ (PCMO), or ZnSe—Ge heterogeneous structure, or oxide relating to Ti、Nb、Hf、Zr、Ta、Ni、V、Zn、Sn、In、Th、Al (e.g. $HfO_2$ film). The above described TE electrode material can be an Ag or TiN film deposited by sputtering. Depending on changes in materials or manufacturing conditions of the variable transistor and the BE, the impedance and the clamp voltage of the first resistive nonvolatile memory element 511 may vary. Via adjustment of the voltage direction and the voltage strength, the resistance state of the first resistive nonvolatile memory element 511 can be changed, such that the nonvolatile logic value of the memory blocks 501A~501D are adjusted. The second resistive nonvolatile memory element 512 is as described for first resistive nonvolatile memory element 511.

In the memory block 501A, a control terminal of the first switch Q1 (e.g. a gate) receives a first control signal PR1. A first terminal (e.g. a source) of the first switch Q1 is coupled to a column programming line 520, and a second terminal (e.g. a drain) of the first switch Q1 is coupled to the BE of the first resistive nonvolatile memory element 511. The TE of the first resistive nonvolatile memory element 511 is coupled to a row line 531, and the BE of the first resistive nonvolatile memory element 511 is coupled to the TE of the second resistive nonvolatile memory element 512. The BE of the second resistive nonvolatile memory element 512 is coupled to a second row line 532. A data input terminal D of the latch unit 513 is coupled to the BE of the first resistive nonvolatile memory element 511 and the TE of the second resistive nonvolatile memory element 512. The control terminal (e.g. a gate) of the second switch Q2 is coupled to a data output terminal Q of the latch unit 513, and a first terminal (e.g. a drain) of the second switch Q2 is coupled to an input line 541 of the FPGA 120, and a second terminal (e.g. a source) of the second switch Q2 is coupled to an output line 542 of the FPGA 120.

The FPGA 120 also includes a third switch Q3, a fourth switch Q4, and a fifth switch Q5, and logic gate LG1, and a second logic gate LG2. The above described third switch Q3, fourth switch Q4, and fifth switch Q5 can be MOSFETs, BJTs, or other switch circuits/elements. For instance (but not limited to the following), the third switch Q3 and the fifth switch Q5 can be NMOSs, and the fourth transistor can be a PMOS. A control terminal (e.g. a gate) of the third switch Q3 receives the first control signal PR1. A terminal of the third switch Q3 (e.g. the source) is coupled to the first row line 531, and a second terminal (e.g. source) of the third switch Q3 is configured to receive a first voltage V1. A first terminal of the fourth switch Q4 (e.g. the drain) is coupled to the first row line 531, and a second terminal of the fourth switch Q4 (e.g. the source) is configured to receive a read voltage Vr. A control terminal (e.g. a gate) of the fifth switch Q5 receives a second control signal PR2, a first terminal (e.g. the source) of the fifth switch Q5 is configured to receive a second voltage V2, and a second terminal (e.g. the drain) is coupled to the second row line 532. The first logic gate LG1 has an input terminal coupled to the signal line SL for receiving the function switch pulse Stri, and an output terminal coupled to the control terminal (e.g. gate) of the fourth switch Q4. The second logic gate LG2 has an input terminal coupled to the output terminal of the first logic gate, and an output terminal coupled to a gate terminal E of the latch unit 513 of each of the memory blocks 501A~501D.

When the FPGA 120 is in the first period T1, the logic level of the control signal line SL is at a low level, such that the latch unit 513 keeps outputting a first logic level corresponding to the original function (e.g. the first function) to the control terminal of the second switch Q2. In other words, during the period of the logic level of the control signal line SL being at the low level, the signal outputted by the output terminal Q of the latch unit 513 is not related to the input signal of the data input terminal D of the latch unit 513. In this case, the MCU 110 can turn on the first switch Q1, the third switch Q3 and the fifth switch Q5, and via the first row line 531, the second row line 532 and the column programming line 520 program the first resistive nonvolatile memory element 511 and/or the second resistive nonvolatile memory element 512 to the resistance state corresponding to a function (e.g. the second function).

For instance, in the case that a first voltage V1 is set to be a high level reference voltage HV (e.g. higher than the threshold voltage of the first resistive nonvolatile memory element 511, but lower than two times of the threshold voltage) and a second voltage V2 is set to be a low level reference voltage LV (e.g. ground voltage or 0 voltage). In the first period T1, the first voltage V1 is transmitted to the TE of the first resistive nonvolatile memory element 511 through the third switch Q3 and the first row line 531, and the second voltage V2 is transmitted to the BE of the second resistive nonvolatile memory element 512 through the fifth switch Q5 and the second row line 532. At this time, if the low level reference voltage (e.g. ground voltage or 0 voltage) is transmitted to the BE of the first resistive nonvolatile memory element 511 through the column programming line 520 and the first switch Q1, then the first resistive nonvolatile memory element 511 is set, and a resistance state of the first resistive nonvolatile memory element 511 is changed to a low resistance state. The resistance value of the described low resistance state is above hundreds of ohm (e.g. a few thousand Ω). Since the voltage difference between the TE and the BE of the second resistive nonvolatile memory element 512 is smaller than the threshold voltage thereof, the resistance state of the second resistive nonvolatile memory element 512 is kept at a high resistance state. The resistance value of the described high resistance state is at least tens of times greater than the resistance value of the low resistance state (e.g. a 10K~100 MΩ).

Conversely, if the high level reference voltage HV is transmitted to the TE of the second resistive nonvolatile memory element 512 through the column programming line 520 and the first switch Q1, and the second voltage V2 having the low level reference voltage LV is transmitted to the BE of the second resistive nonvolatile memory element 512 through the fifth switch Q5 and the second row line 532, then the second resistive nonvolatile memory element 512 is set, and the resistance state of the second resistive nonvolatile memory element 512 is changed to a low resistance state. Since the TE and the BE of the first resistive nonvolatile memory element 511 are both high level reference voltage HV, the resistance state of the first resistive nonvolatile memory element 511 is kept at a high resistance state.

To perform a "reset" operation to change the resistance state of the first resistive nonvolatile memory element 511 from the low resistance state to the high resistance state, the first voltage V1 can be set to the low level reference voltage LV; and the second voltage V2 can be set to an erase voltage EV (e.g. higher than the threshold voltage of the resistive nonvolatile memory element 511, but lower than twice of that threshold voltage). The second voltage V2 is transmitted to the BE of the second resistive nonvolatile memory element 512 through the fifth switch Q5 and the second row line 532. The first voltage V1 is transmitted to the TE of the second resistive nonvolatile memory element 512 through the third switch Q3 and the first row line 531. When the erase voltage EV is transmitted to the BE of the first resistive nonvolatile memory element 511 through the column programming line 520 and the first switch Q1, the first resistive memory element 511 is reset, and the resistance state of the first resistive memory element 511 is changed from the low resistance state to the high resistance state. Since the TE and the BE of first resistive nonvolatile memory element 511 are applied by the erase voltage EV, the resistance state of the second resistive nonvolatile memory element 512 is not changed.

Accordingly, to reset the resistance state of the second resistive nonvolatile memory element 512 from the low resistance state to the high resistance state, the low level reference voltage LV can be transmitted to the TE of the second resistive nonvolatile memory element 512 through the column programming line 520 and the first switch Q1. Since the TE and the BE of first resistive nonvolatile memory element 511 are the low level reference voltage LV and erase voltage EV, the resistance state of the second resistive nonvolatile memory element 512 does not change from the low resistance state to the high resistance state. Since the TE and the BE of first resistive memory element 511 are both low level reference voltage LV, the resistance state of the first resistive nonvolatile memory element 511 is not changed.

Based on the above, during the programming period of the FPGA 120 in the first period T1, the first switch Q1, the third switch Q3, and the fifth switch Q5 are turned on, the fourth switch Q4 is turned off, and the MCU 110 can program an resistance state corresponding to a new function (e.g. the second function) to the first resistive nonvolatile memory element 511 and/or the second resistive nonvolatile memory element 512 via the first row line 531, the second row line 532, and the column programming line 520. During the programming period, since the output signal of the output terminal Q of the latch unit 513 is not related to the input signal of the data input terminal D of the latch unit 513, the latch unit 513 can keep outputting the first logic level corresponding to the original function (e.g. the first function) to the control terminal of the second switch Q2. The programming of the second function does not affect/interrupt the execution of the first function.

While the latch unit 513 of the FPGA 120 is sampling, that is, when the function switch pulse Stri is in the control signal line SL, the fourth switch Q4 and the fifth switch Q5 are connected, the first switch Q1 and the third switch Q3 are turned off During the sampling period, the latch unit 513 is triggered by a signal from the gate terminal E to sample the input signal of the input terminal D, i.e. samples the division voltage formed by the first nonvolatile memory element 511 and the second nonvolatile memory element 512. For instance (but not limited to), during the sampling period, the first voltage V1 and the read voltage Vr are both set as a system voltage Vcc (e.g. lower than the threshold voltage of the first resistive nonvolatile memory element 511), and the voltage of the second voltage V2 and the column programming line 520 are both set as the low level reference voltage LV (e.g. ground voltage or 0 voltage). When the first resistive nonvolatile memory 511 is in the high resistance state and the second resistive nonvolatile memory 512 is in the low resistance state, the logic value sampled by the latch unit 513 through the data input terminal D is 0. When the first resistive nonvolatile memory 511 is the low resistance state and the second resistive nonvolatile memory 512 is the high resistance state, the logic value sampled by the latch unit 513 through the data input terminal D is 1. As a result, the FPGA 120 can terminate the first period T1 after receiving the function switch pulse Stri, and instantly switch from the original function (e.g. the first function) to a new function (e.g. the second function), without extra waiting time.

Note that the programmable circuit 100 can close the input terminal D of the latch unit 513 during non-sampling period (retention period), causing the output terminal Q of the latch unit 513 to keep the sampling result of the latch unit 513. Therefore, during the non-sampling and the non-programming period, the TEs and BEs of all resistive nonvolatile memory elements of all of the memory blocks 501A~501D are not supplied with power, thus reducing current leakage of a bleeder circuit and effectively reducing power consumption.

Figure 6:
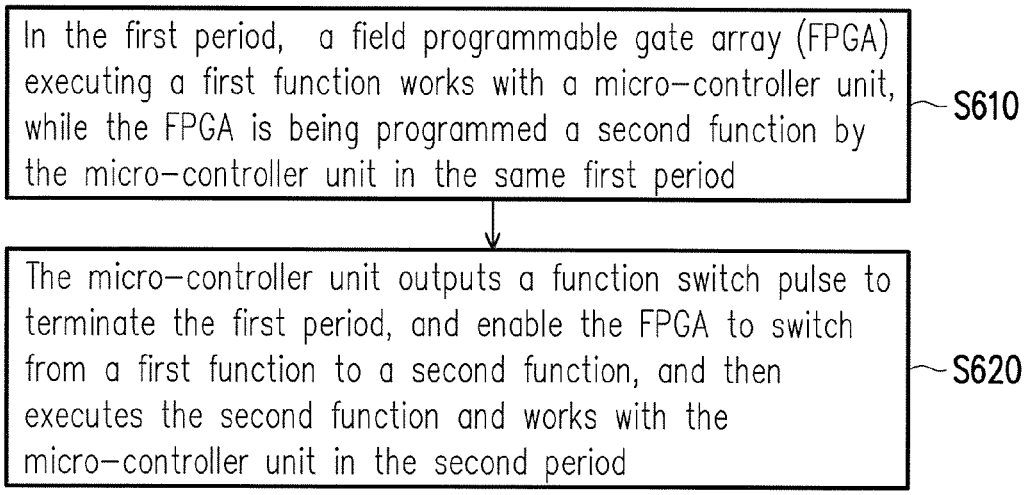

Refer to FIG. 6. FIG. 6 is an operation method of a function programmable circuit from an embodiment of the present disclosure. In step S610, in the first period, FPGA executes the first function and works with a MCU while the FPGA is being programmed a second function via the MCU in the same first period. In step S620, the MCU outputs a function switch pulse to terminate the first period and enable the FPGA to switch from the first function to the second function, and the FPGA executes the second function and works with the MCU in the second period. Refer to previous embodiments for the operation method of the present embodiment.

Based on the above, the FPGA 120 described in the embodiments can be controlled by the MCU 110. In the first period T1, the MCU 110 is capable of programming a second function to the FPGA 120 while controlling the FPGA 120 to execute the first function. Therefore, when the FPGA 120 receives the function switch pulse Stri from the MCU 110, the FPGA 120 is capable of switching from the first function to the second function instantly and terminating the first period without wasting additional time for programming. Additionally, the latch unit 513 of the FPGA 120 can effectively reduce current leakage of the first resistive nonvolatile memory element 511 and the second resistive nonvolatile memory element 522, so as to improve the power consumption of the FPGA 120.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims and their equivalents.

What is claimed is:
1. A function programmable circuit, comprising:
a micro-controller unit (MCU); and
a field programmable gate array (FPGA) coupled to the MCU and configured to execute a first function and work with the MCU in a first period while the MCU programs a resistance state corresponding to a second function to the FPGA in the same first period, wherein a resistance state corresponding to the first function is different from the resistance state corresponding to the second function;
wherein the FPGA is controlled by a function switch pulse generated by the MCU to terminate the first period so as to switch from the first function to the second function, and execute the second function and work with the MCU in a second period.

2. The function programmable circuit of claim 1, wherein the FPGA further comprises a plurality of memory blocks, and one of the memory blocks comprises:
a first switch, having a first terminal coupled to a column programming line;
a first resistive nonvolatile memory element, having a bottom electrode and a top electrode, wherein the bottom electrode of the first resistive nonvolatile memory element is coupled to a second terminal of the first switch, and the top electrode of the first resistive nonvolatile memory element is coupled to a first row line;

a second resistive nonvolatile memory element, having a bottom electrode and a top electrode, wherein the top electrode of the second resistive nonvolatile memory element is coupled to the bottom electrode of the first resistive nonvolatile memory element, and the bottom electrode of the second resistive nonvolatile memory element is coupled to a second row line;

a latch unit having a data input terminal coupled to the bottom electrode of the first resistive nonvolatile memory element and the top electrode of the second resistive nonvolatile memory element; and a second switch having a control terminal, a first terminal and a second terminal, wherein the control terminal of the second switch is coupled to a data output terminal of the latch unit, the first terminal of the second switch is coupled to an input line of the FPGA, and the second terminal of the second switch is coupled to an output line of the FPGA.

3. The function programmable circuit of claim 2, wherein in the first period, the latch unit keeps outputting a first logic level corresponding to the first function to the control terminal of the second switch, while simultaneously the MCU programs the resistance state corresponding to the second function to the first resistive nonvolatile memory element or the second resistive nonvolatile memory element via the first row line, the second row line, the column programming line, and the first switch.

4. The function programmable circuit of claim 2, wherein the FPGA further comprises:

a third switch, having a first terminal and a second terminal, wherein the first terminal of the third switch is coupled to the first row line, and the second terminal of the third switch is configured to receive a first voltage;

a fourth switch, having a first terminal and a second terminal, wherein the first terminal of the fourth switch is coupled to the first row line, and the second terminal of the fourth switch is configured to receive a read voltage; and a fifth switch, having a first terminal and a second terminal, wherein the first terminal of the fifth switch is configured to receive a second voltage, and the second terminal of the fifth switch is coupled to the second row line.

5. The function programmable circuit of claim 4, wherein in a sampling period of the latch unit, the fourth switch and the fifth switch are turned on, the third switch is turned off, and the latch unit samples a division voltage formed by the first resistive nonvolatile memory element and the second resistive nonvolatile memory element.

6. The function programmable circuit of claim 4, wherein in a programming period within the first period, the first switch, the third switch, and the fifth switch are turned on, the fourth switch is turned off, and the MCU programs the resistance state corresponding to the second function to the first resistive nonvolatile memory element or the second resistive nonvolatile memory element via the first row line, the second row line, and the column programming line.

7. The function programmable circuit of claim 4, wherein the FPGA further comprises:

a first logic gate, having an input terminal and an output terminal, wherein the input terminal of the first logic gate is configured to receive the function switch pulse, and the output terminal of the first logic gate is coupled to a control terminal of the fourth switch; and a second logic gate, having an input terminal and an output terminal, wherein the input terminal of the second logic gate is coupled to the output terminal of the first logic gate, and the output terminal of the second logic gate is coupled to the gate terminals of the latch units of the memory blocks.

8. An operation method of a function programmable circuit, comprising:

executing a first function and working with a microcontroller unit (MCU), by a field programmable gate array (FPGA), in a first period, while the MCU programs a resistance state corresponding to a second function to the FPGA in the same first period, wherein a resistance state corresponding to the first function is different from the resistance state corresponding to the second function; and outputting a function switch pulse to the FPGA, by the MCU, to terminate the first period, and enable the FPGA to switch from the first function to the second function, and then execute the second function and work with the MCU in a second period.

* * * * *